(12) United States Patent
Oh et al.

(10) Patent No.: US 11,892,159 B2
(45) Date of Patent: Feb. 6, 2024

(54) SURFACE LIGHT SOURCE MODULE AND METHOD OF MANUFACTURING THE SAME

(71) Applicant: LUMENS CO., LTD., Yongin-si (KR)

(72) Inventors: Seung Hyun Oh, Yongin-si (KR); Pyeong Guk Kim, Yongin-si (KR); Jung Hyun Park, Yongin-si (KR)

(73) Assignee: LUMENS CO., LTD., Yongin-si (KR)

( * ) Notice: Subject to any disclaimer, the term of this patent is extended or adjusted under 35 U.S.C. 154(b) by 0 days.

(21) Appl. No.: 17/952,914

(22) Filed: Sep. 26, 2022

(65) Prior Publication Data

US 2023/0103849 A1 Apr. 6, 2023

(30) Foreign Application Priority Data

Oct. 1, 2021 (KR) .......................... 10-2021-0130960

(51) Int. Cl.
*F21V 9/30* (2018.01)
*F21V 3/00* (2015.01)
*F21Y 103/10* (2016.01)

(52) U.S. Cl.
CPC .................. *F21V 9/30* (2018.02); *F21V 3/00* (2013.01); *F21Y 2103/10* (2016.08)

(58) Field of Classification Search
CPC .......... F21V 9/30; F21V 3/00; F21Y 2103/10; F21Y 2105/16; F21Y 2115/10; H01L 25/167; H01L 25/0753; F21K 9/64–65; F21K 9/68; F21K 9/90
See application file for complete search history.

(56) References Cited

U.S. PATENT DOCUMENTS

2021/0036050 A1\* 2/2021 Hiraide ................. H01L 27/156

\* cited by examiner

*Primary Examiner* — Anne M Hines
*Assistant Examiner* — Jose M Diaz
(74) *Attorney, Agent, or Firm* — Mei & Mark LLP

(57) ABSTRACT

A surface light source module includes a substrate, a plurality of light-emitting elements mounted on the substrate, a first optical layer disposed on the light-emitting elements to cover the light-emitting elements and configured to disperse light emitted from the light-emitting elements, and a second optical layer disposed on the first optical layer and configured to absorb the light emitted from the light-emitting elements and emit light of a different wavelength band from a wavelength of the absorbed light, wherein a distance from an upper surface of the first optical layer to an upper surface of the second optical layer has a value less than a distance from an upper surface of the substrate to the upper surface of the first optical layer.

20 Claims, 7 Drawing Sheets

SURFACE LIGHT SOURCE MODULE AND METHOD OF MANUFACTURING THE SAME

CROSS-REFERENCE TO RELATED APPLICATION

This application is based on and claims priority under 35 U.S.C. § 119 to Korean Patent Application No. 10-2021-0130960, filed on Oct. 1, 2021, in the Korean Intellectual Property Office, the disclosure of which is incorporated by reference herein in its entirety.

BACKGROUND

1. Field

One or more embodiments relate to a surface light source module and a method of manufacturing the same.

2. Description of the Related Art

A light-emitting diode (LED) refers to a type of semiconductor which includes a light emission source formed of PN diodes of a compound semiconductor to realize light of various colors. Light-emitting elements as above have a long lifespan, are compact and lightweight, and can be driven at a low voltage. In addition, these LEDs are rigid against impact and vibration, do not require preheating time and complicated driving, and may be mounted on a substrate or lead frame in various forms and packaged, and thus may be modularized for various purposes and used in backlight units or various types of lighting devices, etc.

In particular, the light-emitting elements as above are widely used as a lighting device of a vehicle due to the advantages described above. Recently, with the development of lighting technology, the form of a light source used for exterior lighting of a vehicle is gradually changing from a point light source to a surface light source. Compared to point light sources, surface light sources have a higher uniformity of output light, less glare, and better esthetic impression by creating soft shadows, and thus are increasingly preferred.

Rear lamps arranged at the rear of a vehicle include a brake light for guiding whether the vehicle is braked, a tail light for informing a driver or pedestrian of the location of another vehicle, a turn indicator for outputting a signal such as a direction to drive, a reversing light that is turned on when the vehicle is reversing, or the like. Among them, the brake light and the tail light are generally irradiated with red light.

A surface light source module for a lamp of a vehicle, according to the related art, includes a thick phosphor layer disposed on a light-emitting element or has increased phosphor content in order to evenly output light through a light-emitting surface. However, according to this method, cost is increased and the light-emitting efficiency is decreased due to the increased proportion of phosphor. In addition, when the number of light-emitting elements to be used is reduced by increasing an arrangement interval between the light-emitting elements to reduce the cost, the proportion of phosphor is to be further increased to improve the uniformity of light, which causes another cost increase.

SUMMARY

One or more embodiments provide a surface light source module having excellent light uniformity despite reduced phosphor content.

One or more embodiments also provide a surface light source module, for which the design diversity may be ensured and the outer appearance of which may be improved.

One or more embodiment also provide a method of manufacturing a surface light source module, for which the production process may be simplified and by which high productivity and economic feasibility may be provided.

Additional aspects will be set forth in part in the description which follows and, in part, will be apparent from the description, or may be learned by practice of the presented embodiments of the disclosure.

According to one or more embodiments, a surface light source module includes a substrate, a plurality of light-emitting elements mounted on the substrate, a first optical layer disposed on the light-emitting elements to cover the light-emitting elements and configured to disperse light emitted from the light-emitting elements, and a second optical layer disposed on the first optical layer and configured to absorb the light emitted from the light-emitting elements and emit light of a different wavelength band from a wavelength of the absorbed light, wherein a distance from an upper surface of the first optical layer to an upper surface of the second optical layer has a value less than a distance from an upper surface of the substrate to the upper surface of the first optical layer.

According to an embodiment, a ratio $H_1/H$ between a distance $H_1$ from the upper surface of the substrate to the upper surface of the first optical layer and a distance $H$ from the upper surface of the substrate to the upper surface of the second optical layer may be greater than or equal to about 0.60 and equal to or less than about 0.85.

According to an embodiment, the plurality of light-emitting elements may be arranged apart from each other at certain distances on the substrate, and a distance between adjacent light-emitting elements and a distance from the upper surface of the first optical layer to the upper surface of the second optical layer may be in a proportional relationship.

According to an embodiment, the distance between adjacent light-emitting elements may be twice or more a width of each light-emitting element.

According to an embodiment, a ratio $L/X$ between a width $L$ of each light-emitting element and a distance $X$ between adjacent light-emitting elements may be greater than or equal to about 0.25 and equal to or less than about 0.5.

According to an embodiment, the width of each light-emitting element may be 0.3 mm or less.

According to an embodiment, the first optical layer may include a transparent resin, and the second optical layer may include a light-converting material.

According to an embodiment, the light-converting material may absorb light, convert the light into light having a dominant wavelength of about 570 nm to about 740 nm, and emit the converted light.

According to an embodiment, the surface light source module may further include a third optical layer which is disposed on the second optical layer and blocks light incident from the outside.

According to an embodiment, the third optical layer may include a reflective film or an anti-reflective film, each attached to the second optical layer.

According to one or more embodiments, a method of manufacturing a surface light source module, includes preparing a substrate, mounting a plurality of light-emitting elements on the substrate, accommodating, in a case, the substrate on which the light-emitting elements are mounted, and then forming, on the light-emitting elements, a first optical layer which covers the light-emitting elements and disperses light emitted from the light-emitting elements, forming, on the first optical layer, a second optical layer configured to absorb the light emitted from the light-emitting elements and emit light of a different wavelength band from a wavelength of the absorbed light, and manufacturing a surface light source module by cutting, in a set size, the substrate having the plurality of, integrally formed light-emitting elements mounted thereon, the first optical layer, and the second optical layer, wherein a distance from an upper surface of the first optical layer to an upper surface of the second optical layer has a value less than a distance from an upper surface of the substrate to the upper surface of the first optical layer.

According to an embodiment, a ratio $H_1/H$ between a distance $H_1$ from the upper surface of the substrate to the upper surface of the first optical layer and a distance H from the upper surface of the substrate to the upper surface of the second optical layer may be greater than or equal to about 0.60 and equal to or less than about 0.85.

According to an embodiment, the plurality of light-emitting elements may be arranged apart from each other at certain distances on the substrate, and a distance between adjacent light-emitting elements and a distance from the upper surface of the first optical layer to the upper surface of the second optical layer may be in a proportional relationship.

According to an embodiment, the distance between adjacent light-emitting elements may be twice or more a width of each light-emitting element.

According to an embodiment, a ratio L/X between a width L of each light-emitting element and a distance X between adjacent light-emitting elements may be greater than or equal to about 0.25 and equal to or less than about 0.5.

According to an embodiment, the width of each light-emitting element may be 0.3 mm or less.

According to an embodiment, the first optical layer may include a transparent resin, and the second optical layer may include a light-converting material.

According to an embodiment, the light-converting material may absorb light, convert the light into light having a dominant wavelength of about 570 nm to about 740 nm, and emit the converted light.

According to an embodiment, a third optical layer which is disposed on the second optical layer and blocks light incident from the outside, may be further included.

According to an embodiment, the third optical layer may include a reflective film or an anti-reflective film, each attached to the second optical layer.

In addition to the aforesaid details, other aspects, features, and advantages will be clarified from the following drawings, claims, and detailed description.

BRIEF DESCRIPTION OF THE DRAWINGS

The above and other aspects, features, and advantages of certain embodiments of the disclosure will be more apparent from the following description taken in conjunction with the accompanying drawings, in which.

DETAILED DESCRIPTION

Figure 1:
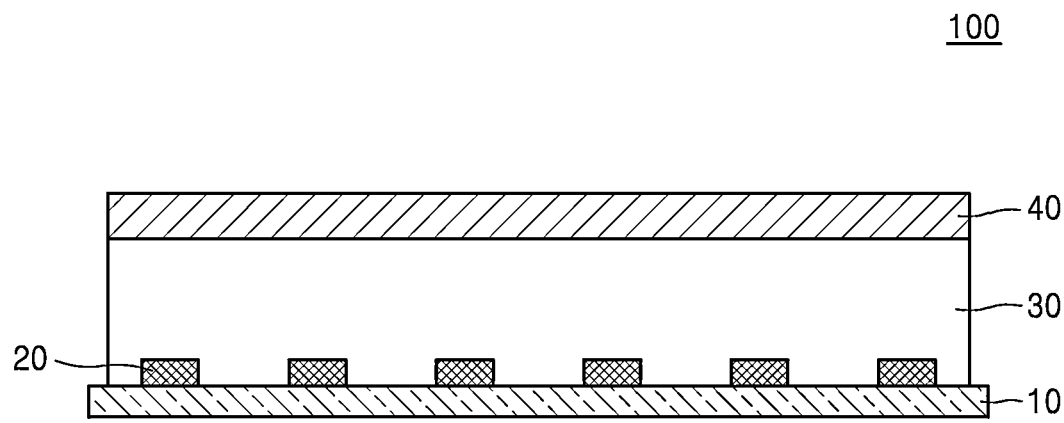
FIG. 1 is a schematic cross-sectional view of a surface light source module according to an embodiment.

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects of the present description. As used herein, the term "and/or" includes any and all combinations of one or more of the associated listed items. Expressions such as "at least one of," when preceding a list of elements, modify the entire list of elements and do not modify the individual elements of the list.

Hereinafter, embodiments of the disclosure will be described in detail with reference to the accompanying drawings, and in the description with reference to the drawings, like reference numerals refer to like elements and redundant descriptions thereof will be omitted.

As the disclosure allows for various changes and numerous embodiments, particular embodiments will be illustrated in the drawings and described in detail in the written description. The effects and features of the present embodiments, and ways to achieve them will become apparent by referring to details that will be described later in detail with reference to the drawings. However, the present embodiments are not limited to the embodiments disclosed below but may be embodied in various forms.

It will be understood that although the terms "first," "second," etc. may be used herein to describe various elements, these elements should not be limited by these terms. These terms are only used to distinguish one element from another.

In the embodiments below, singular expressions, unless defined otherwise in contexts, include plural expressions.

In the embodiments below, it will be further understood that the terms "comprise" and/or "have" used herein specify the presence of stated features or elements, but do not preclude the presence or addition of one or more other features or elements.

In the embodiments below, it will be understood that when a portion such as a unit, an area, or an element is referred to as being "on" or "above" another portion, it can be directly on or above the other portion, or intervening portion may also be present.

In the embodiments below, terms such as "connect" or "couple" do not necessarily mean direct and/or fixed connection or coupling between two members, unless the context clearly indicates otherwise, and do not necessarily preclude another member being interposed between the two members.

This means that a feature or element described in the specification is present, and does not preclude the possibility that one or more other features or elements may be added.

When an embodiment is implementable in another manner, a certain process order may be different from a described one. For example, two processes that are consecutively described may be substantially simultaneously performed or may be performed in an opposite order to the described order.

Also, in the drawings, for convenience of description, sizes of elements may be exaggerated or contracted. For example, since sizes and thicknesses of elements in the drawings are arbitrarily illustrated for convenience of explanation, the embodiments below are not limited thereto.

Figure 2:
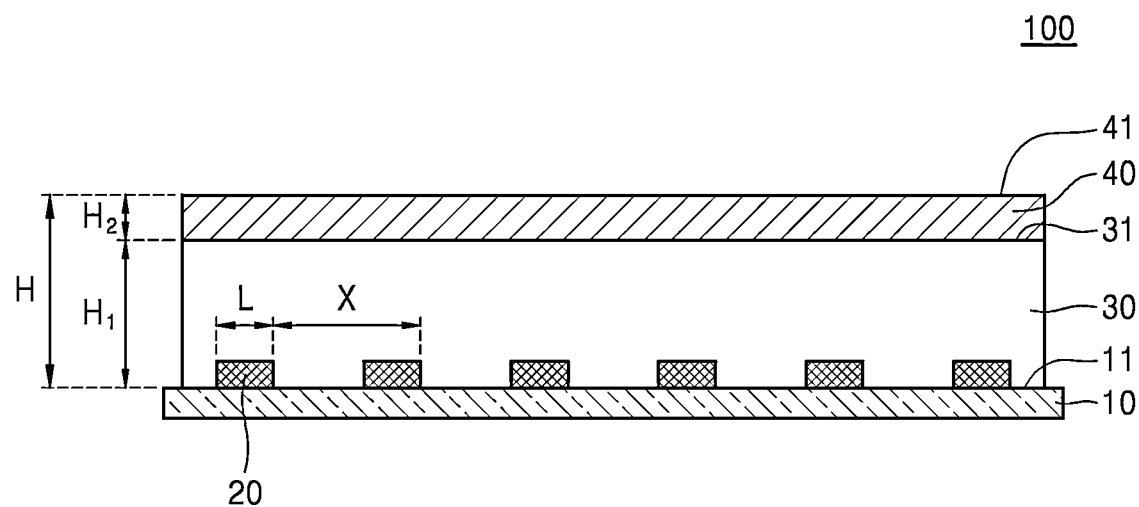
FIG. 2 is a diagram for describing an upper surface of a first optical layer and an upper surface of a second optical layer and a width and arrangement intervals between light-emitting elements.
Figure 3:
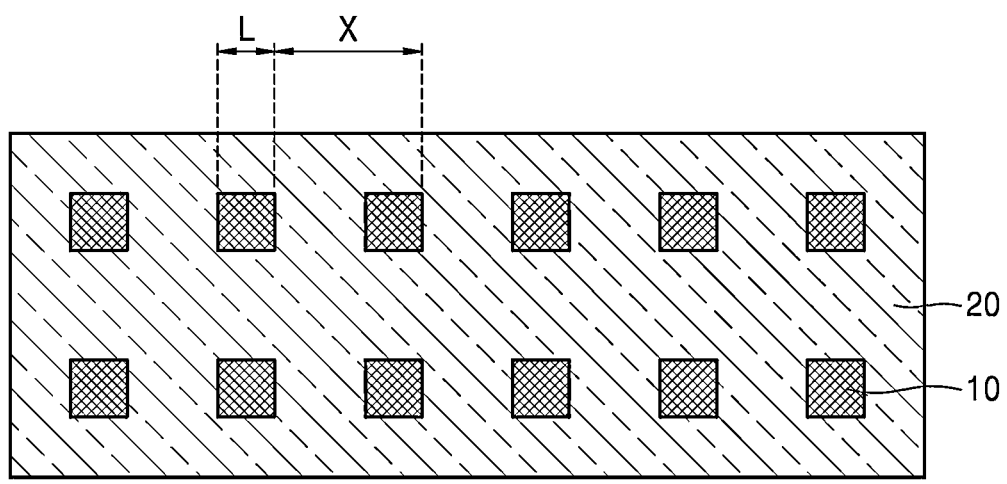
FIG. 3 is a diagram for describing an arrangement of a plurality of light-emitting elements.

FIG. 1 is a schematic cross-sectional view of a surface light source module 100 according to an embodiment. FIG. 2 is a diagram for describing an upper surface 31 of a first optical layer 30 and an upper surface 41 of a second optical layer 40 and a width and arrangement intervals between light-emitting elements 20. FIG. 3 is a diagram for describing an arrangement of the plurality of light-emitting elements 20.

Referring to FIGS. 1 to 3, the surface light source module 100 according to an embodiment includes a substrate 10, the plurality of light-emitting elements 20 mounted on the substrate 10, the first optical layer 30 disposed on the light-emitting elements 20 and the second optical layer 40 disposed on the first optical layer 30.

The substrate 10 of the surface light source module 100 may include a material or a conductive material, which has suitable mechanical strength and insulation characteristics, such that the plurality of light-emitting elements 20 are mounted thereon and the first optical layer 30 is supported thereby. For example, the substrate 10 may include a printed circuit board (PCB) in which a multiple layers of an epoxy-based resin sheet are formed. Also, the substrate 10 may include a flexible printed circuit board (FPCB). Moreover, the substrate 10 may include a synthetic resin substrate such as a resin or glass epoxy, or a ceramic substrate in consideration of thermal conductivity, or a metal substrate such as insulated aluminum, copper, zinc, tin, lead, gold, silver, or the like, or substrates in the form of a plate or a lead frame.

In further detail, the substrate 10 may include a flat-type metal substrate containing a relatively inexpensive material such as aluminum, iron, or copper, and various insulating layers may be formed on the substrate 10 by performing various oxidation processes may be performed on a surface of the substrate 10. In addition, the substrate 10 may be formed by selecting at least one of epoxy mold compound (EMC), polyimide (PI), ceramic, graphene, glass synthetic fiber, and combinations thereof in order to improve the processability.

The substrate 10 may be electrically connected to the light-emitting elements 20, and may be used as a medium for electrical signal transmission between the light-emitting elements 20 and a circuit substrate. Circuit elements and electrodes may be provided on one surface of the substrate 10.

The substrate 10 may reflect light emitted from the light-emitting elements 20. When light emitted from the light-emitting elements 20 returns to the substrate 10, the light may be reflected from an upper surface 11 of the substrate 10 so as to be emitted in an upward direction of the surface light source module 100. Alternatively, although not shown in the drawings, an additional reflective layer may be formed on the upper surface 11 of the substrate 10. The reflective layer may be formed by coating or stacking a metal having a high reflectance, on the upper surface 11 of the substrate 10, or may be formed by attaching a film-type reflective sheet.

The light-emitting elements 20 mounted on the substrate 10 may be flip-chip type light-emitting elements 20. In addition, the light-emitting elements 20 may include various types of horizontal or vertical LEDs or various types of light-emitting elements 20 in which signal transmission media such as various bumps, wires or solders are installed.

The light-emitting elements 20 may be disposed on the substrate 10 to receive an electrical signal from the substrate 10 to emit light in an upward direction of the surface light source module 100. The light-emitting elements 20 emit light through one surface thereof, and may emit light of different wavelengths according to a composition ratio of a compound semiconductor. For example, the light-emitting elements 20 may include a blue LED emitting light of a blue wavelength, but are not limited thereto, and may include an LED emitting light of various wavelengths or an ultraviolet LED.

The light-emitting elements 20 mounted on the substrate 10 may have a size of 0.3 mm or less. The light-emitting elements 20 may include a small LED having a size of 200 um to 300 um or a mini-LED having a size of 100 um to 200 um.

The plurality of light-emitting elements 20 may be arranged apart from each other at certain intervals on the substrate 10. The light-emitting elements 20 mounted on the substrate 10 are not limited to the illustrated example, and various numbers of light-emitting elements 20 may be mounted on the substrate 10. In addition, the light-emitting elements 20 mounted on the substrate 10 may be arranged in one or more columns or rows. The disclosure is not limited thereto, and the light-emitting elements 20 may be mounted in various patterns or in a certain shape, on a plane of the substrate 10 formed according to the intention of the designer.

Light emitted from the plurality of light-emitting elements 20 may be emitted in an upward direction of the surface light source module 100, and may be diffused through the first optical layer 30 and the second optical layer 40, which are to be described later, and output in a uniform size to the outside of the surface light source module 100.

The first optical layer 30 may be disposed on the light-emitting elements 20 to cover the substrate 10 and the light-emitting elements 20 mounted on the substrate 10. The first optical layer 30 may be formed through transfer molding, injection molding, etc., and include a molding covering both upper and side surfaces of the light-emitting elements 20 to protect the light-emitting elements 20.

The first optical layer 30 may include a transparent resin to allow light emitted from the light-emitting elements 20 to pass therethrough. For example, the first optical layer 30 may include flexible polyimide (PI), polyethylene terephthalate (PET), polyethylene naphthalate (PEN), or polycarbonate (PC) material, but is not limited thereto.

Light passing through the first optical layer 30 may be scattered and diffused while passing through the first optical layer 30. Rayleigh scattering occurs when light passes through the first optical layer 30, which is transparent. Rayleigh scattering occurs the more the shorter a wavelength of light, and the longer a movement path of light, the more scattering occurs. Using a blue LED emitting light of a relatively short wavelength as a light source may be more advantageous for implementation of a surface light source.

The first optical layer 30 may further include a diffusion material for light diffusion. For example, the first optical layer 30 may include a transparent resin to which a diffusion material is added, or an opaque resin to which a diffusion material is added.

The second optical layer 40 may be disposed on the first optical layer 30. The second optical layer 40 may be stacked on the first optical layer 30 to be integrally provided as a single body with the first optical layer 30.

The second optical layer 40 is a layer that may convert a color of incident light, and may include a light-converting material and absorb light in a certain wavelength range and may emit light in a wavelength range different from the absorbed light. In addition, the second optical layer 40 may perform a function of implementing a point light source as a surface light source by causing light diffusion when the light-converting material absorbs and emits light.

The light-converting material may absorb light, convert the light into scarlet or red light having a dominant wavelength of about 570 nm to about 740 nm, and emit the converted light.

When $H_1$ is a distance from the upper surface 11 of the substrate 10 to the upper surface 31 of the first optical layer 30, and $H_2$ is a distance from the upper surface 31 of the first optical layer 30 to the upper surface 41 of the second optical layer 40, in the surface light source module 100 according to an embodiment, the first optical layer 30 and the second optical layer 40 may be formed such that $H_2$ has a smaller value than $H_1$. That is, the first optical layer 30 having a height $H_1$ may be formed on the upper surface 11 of the substrate 10 to cover the light-emitting elements 20, and the second optical layer 40 having a height $H_2$, which is a value less than the height of the first optical layer 30, may be formed thereon. Accordingly, a transparent layer for scattering light may be formed to have a greater height than a layer for converting a color.

By increasing the height of the first optical layer 30, which mainly has a function of protecting the light-emitting elements 20 in the related art, scattering of light in the first optical layer 30 may occur effectively and the height of the second optical layer 40 may be reduced. In addition, when implementing a surface light source by using only the first optical layer 30 and the second optical layer 40 without using an additional diffusion member such as a lens for light diffusion, unlike in the related art where light diffusion effects are achieved by including the second optical layer 40 that is relatively thick, the height of the second optical layer 40 may be reduced, allowing to remarkably reduce a proportion of phosphor and thus saving the cost, and also reducing light loss and enabling emission of bright and sharp light.

In detail, a ratio $H_1/H$ between the distance $H_1$ from the upper surface 11 of the substrate 10 to the upper surface 31 of the first optical layer 30 and a distance H from the upper surface 11 of the substrate 10 to the upper surface 41 of the second optical layer 40 may have a value greater than 0.5. Preferably, the ratio of $H_1/H$ may have a value of about 0.60 or more and about 0.85 or less. Hereinafter, a preferred ratio will be described in detail with reference to the drawings.

Figure 4:
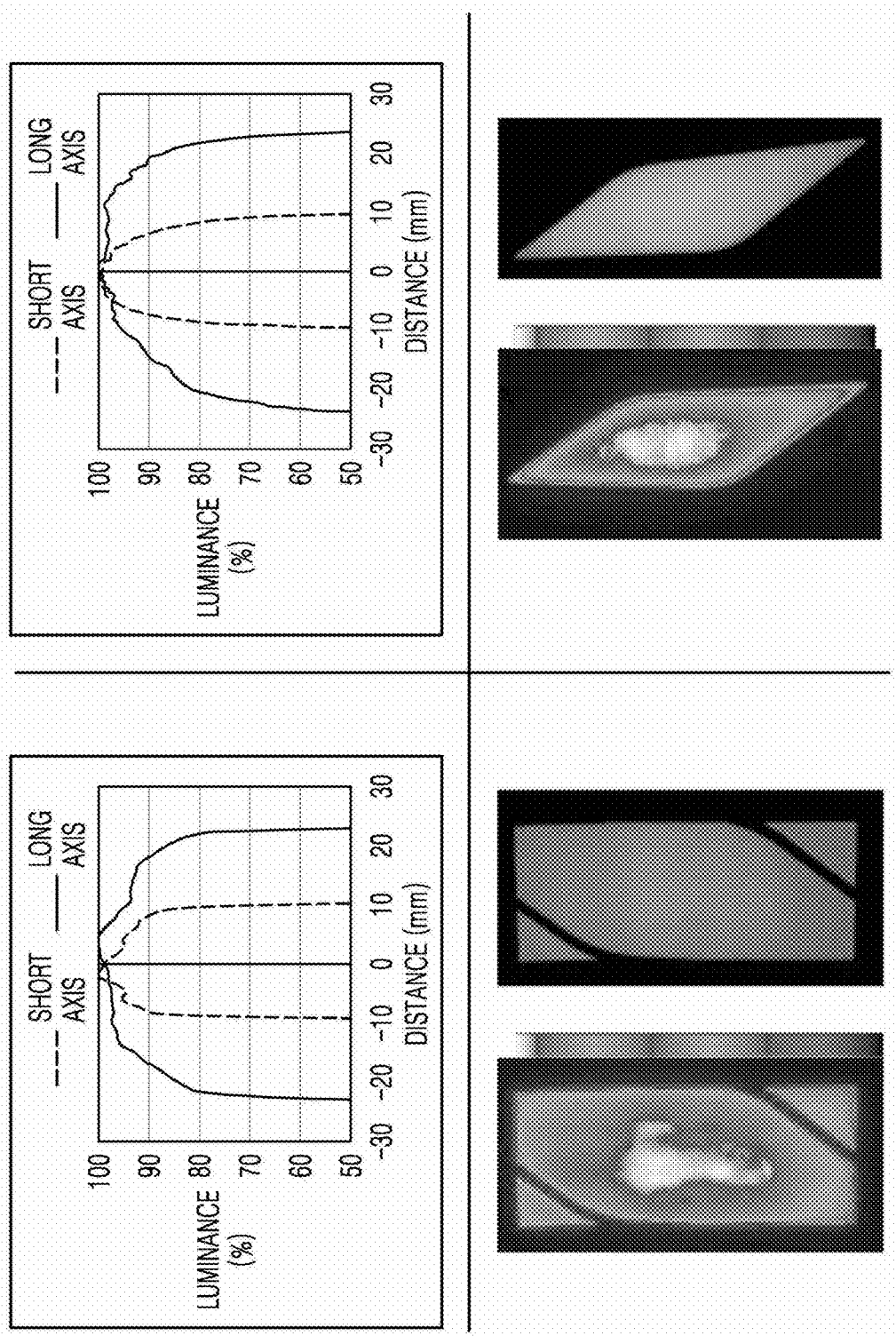
FIG. 4 is a graph showing a difference in luminance uniformity according to a change in a first optical layer.

FIG. 4 is a graph showing a difference in luminance uniformity according to a change in the first optical layer 30. The left side of FIG. 4 shows a luminance graph and a lighting image when a height of the first optical layer 30 is 200 um and a height of the second optical layer 40 is 200 um, and the right side of FIG. 4 shows a luminance graph and a lighting image when the height of the first optical layer 30 is 200 um and the height of the second optical layer 40 is 600 um. A right side image of the lighting image is an image when a Rear Combination Lamp (RCL) cover is applied over the surface light source module 100.

Referring to the left side of FIG. 4, when the height of the first optical layer 30 and the height of the second optical layer 40 are provided to be equal, that is, when the ratio of $H_1/H$ is 0.5, hot spots are generated in the lighting image, decreasing the uniformity of output light. Thus, in order to implement a surface light source that outputs uniform light, the ratio of $H_1/H$ is to exceed 0.5, and as shown on the right side of the drawing, when the ratio of $H_1/H$ is 0.75, a surface light source with excellent luminance uniformity may be implemented, and when the ratio of $H_1/H$ may preferably have a value of about 0.60 or more and about 0.85 or less.

In the surface light source module 100 according to an embodiment, a plurality of light-emitting elements 20 are spaced apart from each other at certain distances on the substrate 10, and a distance between adjacent light-emitting elements 20 and the distance $H_2$ from the upper surface 31 of the first optical layer 30 to the upper surface 41 of the second optical layer 40, which is the height of the second optical layer 40, may be in a proportional relationship.

For example, as illustrated in FIG. 3, when the plurality of light-emitting elements 20 are spaced apart by a distance X to form a tiled arrangement, the height $H_2$ of the second optical layer 40 may be proportional to X. That is, when intervals between the light-emitting elements 20 are widened, a surface light source may be implemented by increasing $H_2$, which is the height of the second optical layer 40. When arrangement intervals between the light-emitting elements 20 are widened, hot spots which involve a decrease in uniformity of output light are generated, and the surface light source is viewed as a point light source, and is thus not able to perform a function as a surface light source. To compensate for this, by disposing the second optical layer 40 that has an even greater thickness and diffusing light from the second optical layer 40, light having a uniform luminance may be output.

When a length of one surface of a light-emitting surface of the light-emitting elements 20 is a width L of each light-emitting element 20, the distance X between adjacent light-emitting elements 20 on the substrate 10 may be greater than twice the width L of each light-emitting element 20. Thus, the light-emitting elements 20 may be arranged on the substrate 10 with an interval equal to or greater than the width L of each light-emitting element 20. In order to implement a surface light source having uniform luminance, arranging the light-emitting elements 20 without any intervals therebetween on the substrate 10 may also be considered. However, in this case, a large number of light-emitting elements 20 used increases the cost, and the luminance of light may be higher than necessary. Accordingly, by arranging the light-emitting elements 20 at appropriate intervals and providing a layer for light diffusion, a surface light source that outputs uniform light may be configured. For example, a ratio L/X between the width L of each light-emitting element 20 and the distance X between adjacent light-emitting elements 20 may be about 0.25 or more and about 0.5 or less. Hereinafter, a preferred ratio will be described in detail with reference to the drawings.

Figure 5:
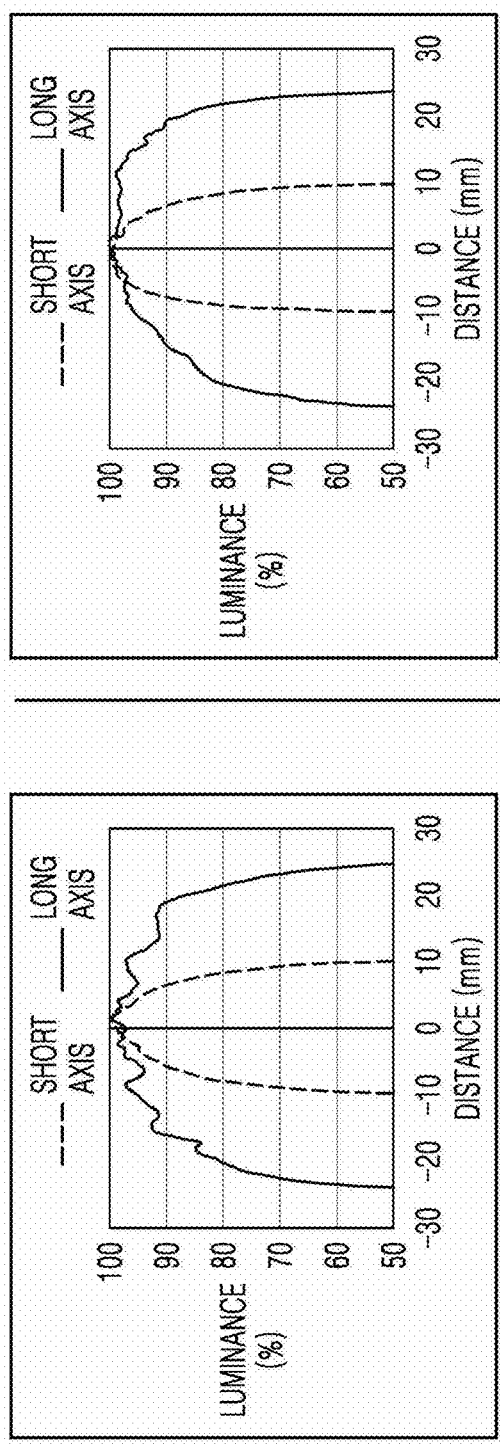
FIG. 5 is a graph showing a difference in luminance uniformity according to a width of each light-emitting element.
Figure 5:
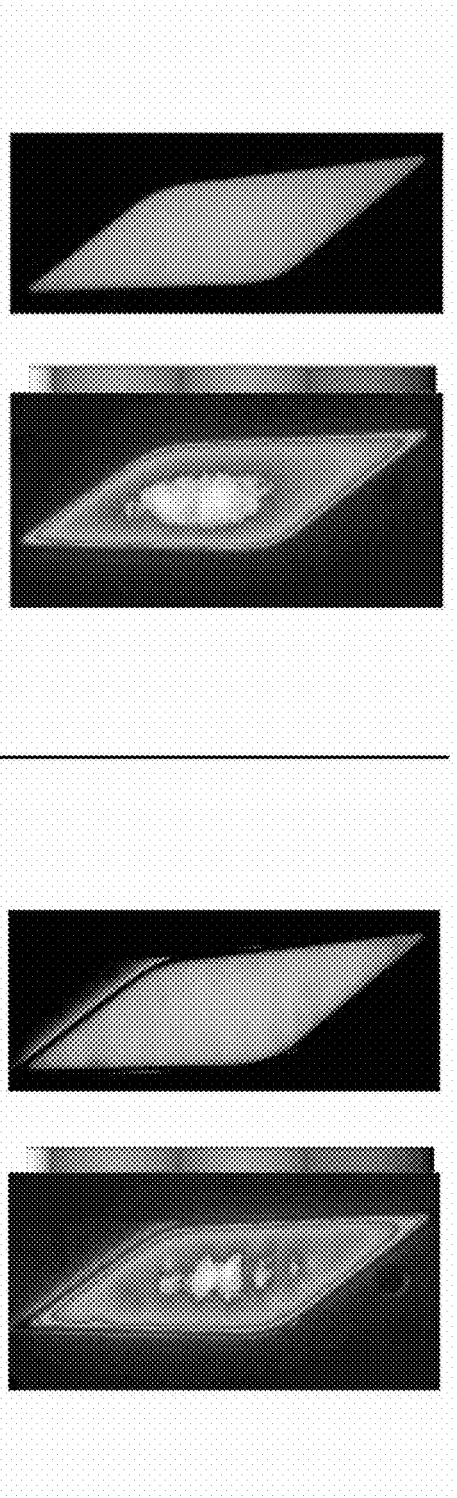

FIG. 5 is a graph showing a difference in luminance uniformity according to a width of each light-emitting element 20, wherein the left side of FIG. 5 shows a luminance graph and a lighting image when a distance between adjacent light-emitting elements 20 is 0.8 mm, and the width of each light-emitting element 20 is 0.1 mm, and the right side of FIG. 5 shows a luminance graph and a lighting image when the distance between adjacent light-emitting elements 20 is 0.8 mm and the width of each light-emitting element 20 is 0.3 mm.

Referring to FIG. 5, when the ratio L/X between the width L of each light-emitting element 20 and the distance X between adjacent light-emitting elements 20 has a value of 0.125 as shown on the left side of FIG. 5, hot spots are generated and the uniformity of the luminance is decreased. Thus, when the ratio L/X between the width L of each light-emitting element 20 and the distance X between adjacent light-emitting elements 20 is 0.375 as shown on the right side of FIG. 5, light having excellent luminance uniformity may be output, when the ratio L/X exceeds 0.5, the number of light-emitting elements 20 to be used increases, which may increase the cost of production. Thus, the ratio L/X between the width L of each light-emitting element 20 and the distance X between adjacent light-emitting elements 20 may be about 0.25 or more and about 0.5 or less.

Figure 6:
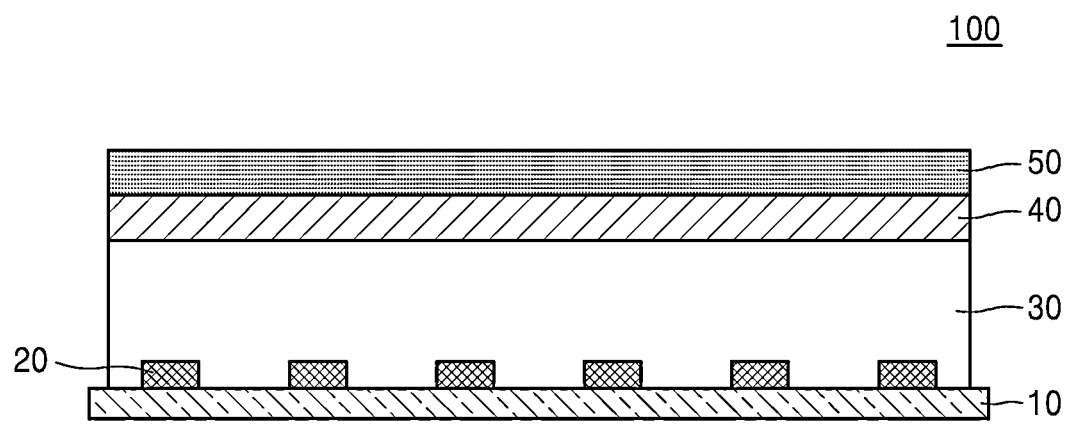
FIG. 6 is a cross-sectional view of a surface light source module according to an embodiment.

FIG. 6 is a cross-sectional view of the surface light source module 100 according to an embodiment.

Referring to FIG. 6, the surface light source module 100 according to an embodiment may further include a third optical layer 50 disposed on the second optical layer 40. The third optical layer 50 may be adhered to the second optical layer 40; for example, the third optical layer 50 may include a reflective film or an anti-reflective film, each attached to the second optical layer 40.

The third optical layer 50 may block light incident from the outside such that a color of the second optical layer 40 is not exposed when the light-emitting elements 20 do not emit light. For example, when the second optical layer 40 includes a red-based light-converting material, the second optical layer 40 emits red light when turned on, but is also observed as red even when no electricity is flowing. The surface light source module 100, which is applied to a rear lamp of a vehicle, may emit red light when turned on, and inform a vehicle or pedestrian in the rear of whether the vehicle is driving. However, also when not turned on, the red color is exposed due to light incident from the outside of the surface light source module 100, making it sometimes difficult to know whether the rear lamp is turned on or not. The third optical layer 50 may be provided to cover the second optical layer 40, and according to the surface light source module 100, to which the third optical layer 50 is applied, when the surface light source module 100 is not operated, light incident from the outside may be blocked to thereby prevent exposure of the color of the second optical layer 140.

When the third optical layer 50 is provided using a reflective film, the third optical layer 50 may reflect most of light incident from the outside to thereby prevent exposure of the color of the second optical layer 40. In this case, the surface light source module 100 may be observed in various colors according to a configuration of the reflective film. When the third optical layer 50 is provided using an anti-reflective film, the third optical layer 50 may absorb most of the light incident from the outside to thereby prevent exposure of the color of the second optical layer 40. In this case, the surface light source module 100 may be observed in a generally dark red color.

By disposing the third optical layer 50 over the second optical layer 40, preset colors of the second optical layer 40 may not be exposed, and thus, the surface light source module 100 may be used as a lighting having various colors, and the design thereof may be freely changed according to the intention of the designer. In addition, when the surface light source module 100 is used as a rear lamp of a vehicle, the exterior design of the vehicle when the lamp is not in operation may be improved.

In addition, the third optical layer 50 may perform a function of protecting the second optical layer 40 from external stimuli such as changes in temperature and humidity. By disposing the third optical layer 50 to cover the second optical layer 40, a complete design may be realized without additional packaging, and the stability of the surface light source module 100 may be secured, thereby providing the surface light source module 100 having excellent reliability.

Figure 7:
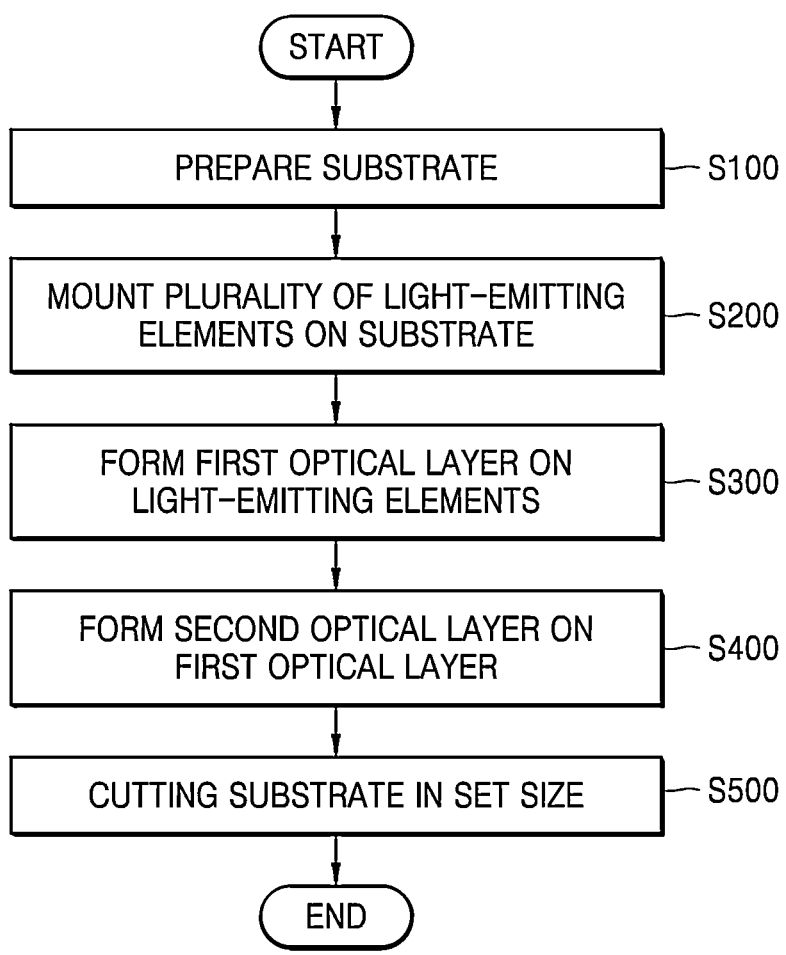
FIG. 7 is a flowchart of a method of manufacturing a surface light source module, according to an embodiment.

FIG. 7 is a flowchart of a method of manufacturing the surface light source module 100, according to an embodiment.

Referring to FIG. 7, the method of manufacturing the surface light source module 100 includes preparing a substrate (S100), mounting a plurality of light-emitting elements on the substrate (S200), forming a first optical layer on the plurality of light-emitting elements (S300), forming a second optical layer on the first optical layer (S400), and manufacturing a surface light source module by cutting the substrate in a set size (S500).

The preparing of the substrate (S100) includes an operation of preparing a substrate on which light-emitting elements may be mounted, and a circuit pattern for electrically connecting a plurality of electronic components to each other may be formed on the substrate, and bumps that are electrically connected to the circuit pattern, or the like, may be formed. The bumps may be formed through a lithographic printing technique or the like.

Here, the preparing of the substrate (S100) may be performed in a state of a mother plate rather than a substrate cut in individual units. As the mounting of the light-emitting elements to be described later (S200) is performed by forming bumps that are electrically connected to the light-emitting elements in a mother plate state without using individual substrates, there is no need to use a carrier jig for transferring a plurality of substrates at once. Accordingly, as mounting of individual substrates on a carrier jig may be omitted, the process time may be shortened, a number of substrates input to a process may be increased, tolerances may be reduced, and the manufacturing costs may be reduced. In addition, after mounting the light-emitting elements, a process of repairing un-lit parts may also be performed in a mother plate state, and the repair may be performed simply and efficiently compared to when the repair is performed in individual units.

The mounting of the plurality of light-emitting elements on the substrate (S200) may include an operation of mounting the plurality of light-emitting elements to be spaced apart from each other at regular intervals on the substrate. The mounting of the light-emitting elements (S200) may be an operation of mounting the light-emitting elements on the substrate by using Surface Mounter Technology (SMT), and in this process, other devices required to drive a surface light source slim module such as various resistors may be mounted under on the substrate. When the light-emitting elements are provided in a flip-chip manner, and are mounted on a substrate, the light-emitting elements may be attached as they are by melting solder bumps formed on a circuit substrate without using a separate connection structure.

After the mounting of the plurality of light-emitting elements on the substrate (S200), forming of a reflective layer on the substrate may be performed. The reflective layer may be formed by coating a metal on an upper surface of the substrate, or a previously formed reflective layer may be attached to an upper portion of the substrate.

The forming of the first optical layer on the light-emitting elements (S300) may be an operation of forming a molding to cover the upper portion of the substrate and the light-emitting elements. The first optical layer may be formed on the light-emitting elements by a transfer molding method, injection molding, or the like.

The forming of the first optical layer (S300) may be an operation of performing molding to cover the entire substrate which is in a state as a mother plate, rather than as individual substrates mounted on a carrier jig. Accordingly, the amount of a mold used for molding may be reduced, the amount of filler to be used may be reduced, and the process time may be shortened. In addition, a cleaning process of removing foreign substances from the mold after performing the molding may be simplified.

The forming of the second optical layer on the first optical layer (S400) may be an operation of forming the second optical layer having a height lower than a height of the first optical layer. The second optical layer may include a light-converting material and may be stacked on the first optical layer. The forming of the second optical layer may be an operation of molding the second optical layer on the first optical layer.

The manufacturing of the surface light source module by cutting the substrate in a set size (S500) may be an operation of manufacturing the surface light source module by cutting, in a set size, the substrate having the integrally formed light-emitting elements on a mother plate of the substrate, the first optical layer, and the second optical layer. To facilitate the cutting, a cutting guide portion such as a punching structure having V-cut grooves or micro-holes may be formed on the substrate prepared in the preparing of the substrate (S100) described above. In this case, the substrate in a state of a mother plate, or the like may be easily cut, thereby shortening the process time for individualizing the surface light source module.

Thus, according to the method of manufacturing a surface light source module, according to an embodiment, the process time may be effectively reduced, the manufacturing cost may be reduced, and mass productivity may be ensured.

Figure 8:
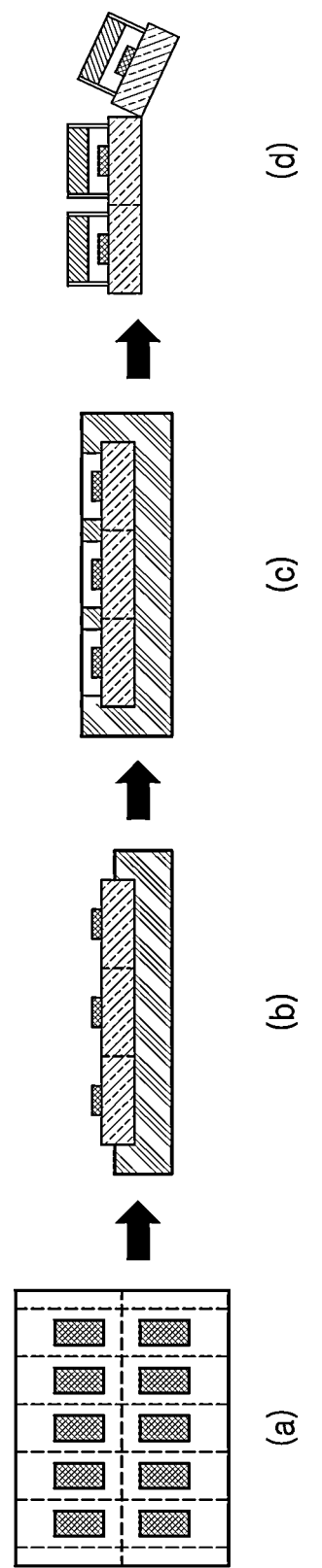
FIG. 8 is a diagram for describing an example of a method of manufacturing a surface light source module, according to the disclosure.

FIG. 8 is a diagram for describing an example of a method of manufacturing a surface light source module, according to the embodiment of FIG. 7.

Referring to FIG. 8, in (a), the preparing of a substrate (S100) is performed, and in (b), the mounting of a plurality of light-emitting elements on the substrate (S200) is performed. Here, a cutting guide portion for cutting may be formed in the prepared substrate, and the plurality of light-emitting elements may be mounted on the substrate in a state as a mother plate. Then, in (c), the forming of a first optical layer (S400) is performed, after which forming of a second optical layer is performed, and in (d), the forming of a surface light source module by cutting (S500) is performed. While FIG. 8 illustrates a process of molding and cutting the light-emitting elements one by one, according to the intention of the designer, a plurality of light-emitting elements may also be molded and cut to form one surface light source module.

The surface light source module according to the embodiments of the disclosure has a simple structure and may emit light of uniform luminance by evenly distributing the light even when a phosphor content thereof is reduced, and the manufacturing cost may be reduced by reducing the phosphor content and reducing a number of light-emitting elements.

In addition, the surface light source module according to embodiments of the disclosure may have improved visibility and better aesthetics, and the degree of design freedom thereof may be increased.

In addition, according to the method of manufacturing a surface light source module according to embodiments of the disclosure, a surface light source module having improved light uniformity may be manufactured, and the manufacturing cost and manufacturing time may be reduced.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope as defined by the following claims.

What is claimed is:

1. A surface light source module comprising:
   a substrate;
   a plurality of light-emitting elements mounted on the substrate;
   a first optical layer formed on the light-emitting elements to cover the light-emitting elements and configured to disperse light emitted from the light-emitting elements;
   a second optical layer disposed on the first optical layer and configured to absorb the light emitted from the light-emitting elements and emit light of a different wavelength band from a wavelength of the absorbed light; and
   a third optical layer which is disposed on the second optical layer and blocks light incident from the outside,
   wherein a distance from an upper surface of the first optical layer to an upper surface of the second optical layer has a value less than a distance from an upper surface of the substrate to the upper surface of the first optical layer.

2. The surface light source module of claim 1, wherein a ratio H1/H between a distance H1 from the upper surface of the substrate to the upper surface of the first optical layer and a distance H from the upper surface of the substrate to the upper surface of the second optical layer is greater than or equal to about 0.60 and equal to or less than about 0.85.

3. The surface light source module of claim 1, wherein the plurality of light-emitting elements are arranged apart from each other at certain distances on the substrate, and a distance between adjacent light-emitting elements and a distance from the upper surface of the first optical layer to the upper surface of the second optical layer are in a proportional relationship.

4. The surface light source module of claim 3, wherein the distance between adjacent light-emitting elements is twice or more a width of each light-emitting element.

5. The surface light source module of claim 4, wherein a ratio L/X between a width L of each light-emitting element and a distance X between adjacent light-emitting elements is greater than or equal to about 0.25 and equal to or less than about 0.5.

6. The surface light source module of claim 5, wherein the width of each light-emitting element is 0.3 mm or less.

7. The surface light source module of claim 1, wherein the first optical layer comprises a transparent resin, and the second optical layer comprises a light-converting material.

8. The surface light source module of claim 7, wherein the light-converting material absorbs light, converts the light into light having a dominant wavelength of about 570 nm to about 740 nm, and emits the converted light.

9. The surface light source module of claim 1, further comprising an additional reflective layer formed on an upper surface of the substrate.

10. The surface light source module of claim 1, wherein the third optical layer comprises a reflective film or an anti-reflective film, each attached to the second optical layer.

11. A method of manufacturing a surface light source module, the method comprising:
preparing a substrate;
mounting a plurality of light-emitting elements on the substrate;
accommodating, in a case, the substrate on which the light-emitting elements are mounted, and then forming, on the light-emitting elements, a first optical layer which covers the light-emitting elements and disperses light emitted from the light-emitting elements;
forming, on the first optical layer, a second optical layer configured to absorb the light emitted from the light-emitting elements and emit light of a different wavelength band from a wavelength of the absorbed light; and
cutting, in a set size, the substrate having the plurality of, integrally formed light-emitting elements mounted thereon, the first optical layer, and the second optical layer,
wherein a distance from an upper surface of the first optical layer to an upper surface of the second optical layer has a value less than a distance from an upper surface of the substrate to the upper surface of the first optical layer.

12. The method of claim 11, wherein a ratio H1/H between a distance H1 from the upper surface of the substrate to the upper surface of the first optical layer and a distance H from the upper surface of the substrate to the upper surface of the second optical layer is greater than or equal to about 0.60 and equal to or less than about 0.85.

13. The method of claim 11, wherein the plurality of light-emitting elements are arranged apart from each other at certain distances on the substrate, and a distance between adjacent light-emitting elements and a distance from the upper surface of the first optical layer to the upper surface of the second optical layer are in a proportional relationship.

14. The method of claim 13, wherein the distance between adjacent light-emitting elements is twice or more a width of each light-emitting element.

15. The method of claim 14, wherein a ratio L/X between a width L of each light-emitting element and a distance X between adjacent light-emitting elements is greater than or equal to about 0.25 and equal to or less than about 0.5.

16. The method of claim 15, wherein the width of each light-emitting element is 0.3 mm or less.

17. The method of claim 11, wherein the first optical layer comprises a transparent resin, and the second optical layer comprises a light-converting material.

18. The method of claim 17, wherein the light-converting material absorbs light, converts the light into light having a dominant wavelength of about 570 nm to about 740 nm, and emits the converted light.

19. The method of claim 11, wherein a third optical layer which is disposed on the second optical layer and blocks light incident from the outside, is further included.

20. The method of claim 19, wherein the third optical layer comprises a reflective film or an anti-reflective film, each attached to the second optical layer.

* * * * *